(12) United States Patent
Neugirg et al.

(10) Patent No.: US 11,037,856 B2
(45) Date of Patent: Jun. 15, 2021

(54) SEMICONDUCTOR CHIP PACKAGE COMPRISING A LEADFRAME CONNECTED TO A SUBSTRATE AND A SEMICONDUCTOR CHIP, AND A METHOD FOR FABRICATING THE SAME

(71) Applicant: Infineon Technologies AG, Neubiberg (DE)

(72) Inventors: Christian Neugirg, Regensburg (DE); Peter Scherl, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/929,296

(22) Filed: Apr. 23, 2020

(65) Prior Publication Data

US 2020/0251400 A1 Aug. 6, 2020

Related U.S. Application Data

(62) Division of application No. 15/724,920, filed on Oct. 4, 2017, now abandoned.

(51) Int. Cl.

| | |
|---|---|
| *H01L 23/373* | (2006.01) |
| *H01L 21/50* | (2006.01) |
| *H01L 25/18* | (2006.01) |
| *H01L 21/48* | (2006.01) |
| *H01L 25/07* | (2006.01) |
| *H01L 23/495* | (2006.01) |
| *H01L 23/31* | (2006.01) |
| *H01L 23/433* | (2006.01) |

(52) U.S. Cl.
CPC .......... *H01L 23/3735* (2013.01); *H01L 21/48* (2013.01); *H01L 21/50* (2013.01); *H01L 23/31* (2013.01); *H01L 23/3121* (2013.01); *H01L 23/4334* (2013.01); *H01L 23/49531* (2013.01); *H01L 23/49541* (2013.01); *H01L 23/49551* (2013.01); *H01L 23/49562* (2013.01); *H01L 23/49575* (2013.01); *H01L 25/072* (2013.01); *H01L 25/18* (2013.01); *H01L 2224/32225* (2013.01); *H01L 2224/40137* (2013.01)

(58) Field of Classification Search
CPC .......... H01L 23/3735; H01L 23/49562; H01L 23/49575; H01L 23/49551; H01L 25/18; H01L 21/50; H01L 25/50
USPC .................. 257/666, E23.079; 438/123, 127
See application file for complete search history.

(56) References Cited

U.S. PATENT DOCUMENTS

| | | | |
|---|---|---|---|
| 6,201,696 B1 | 3/2001 | Shimizu et al. | |
| 6,642,576 B1 | 11/2003 | Shirasawa et al. | |
| (Continued) | | | |

*Primary Examiner* — Robert T Huber
(74) *Attorney, Agent, or Firm* — Harrity & Harrity, LLP

(57) ABSTRACT

A semiconductor chip package may comprise a semiconductor chip disposed on a substrate. The semiconductor chip may have a first surface and a second surface. The first surface of the semiconductor chip may be connected to the substrate. The semiconductor chip package may comprise a leadframe that includes a first lead and a second lead. The first lead of the leadframe may be directly attached to the second surface of the semiconductor chip. The second lead of the leadframe may be directly attached to the substrate. An important aspect in development of the semiconductor chip package is improvement of connections between different components within the package.

20 Claims, 10 Drawing Sheets

(56) References Cited

U.S. PATENT DOCUMENTS

| | | | |
|---|---|---|---|
| 7,521,290 B2* | 4/2009 | Takakusaki | H01L 23/49531 |
| | | | 438/106 |
| 2008/0012045 A1 | 1/2008 | Muto et al. | |
| 2013/0015468 A1 | 1/2013 | Kikuchi | |
| 2013/0285235 A1* | 10/2013 | Murata | H01L 23/16 |
| | | | 257/712 |
| 2015/0060940 A1* | 3/2015 | Muto | H01L 25/165 |
| | | | 257/140 |
| 2016/0104651 A1 | 4/2016 | Asada et al. | |
| 2019/0103342 A1 | 4/2019 | Neugirg et al. | |

* cited by examiner

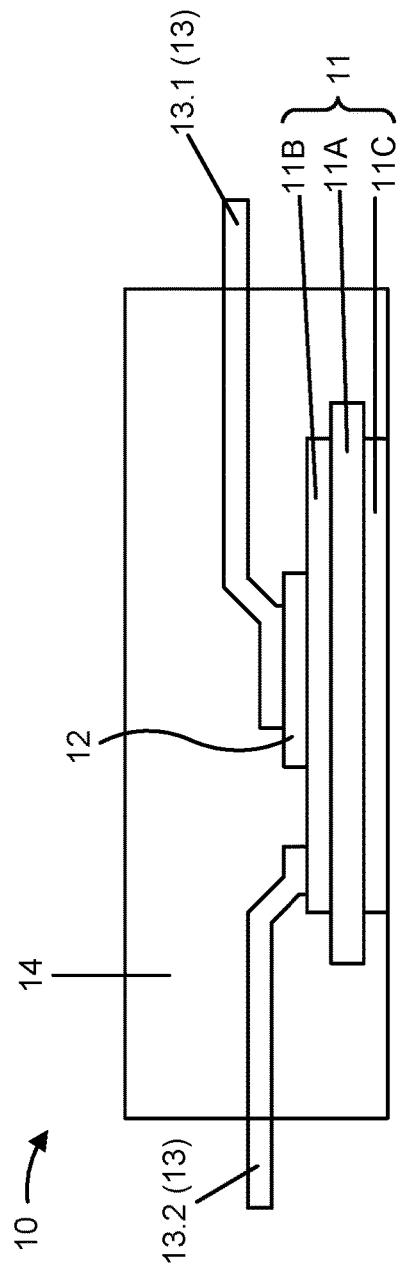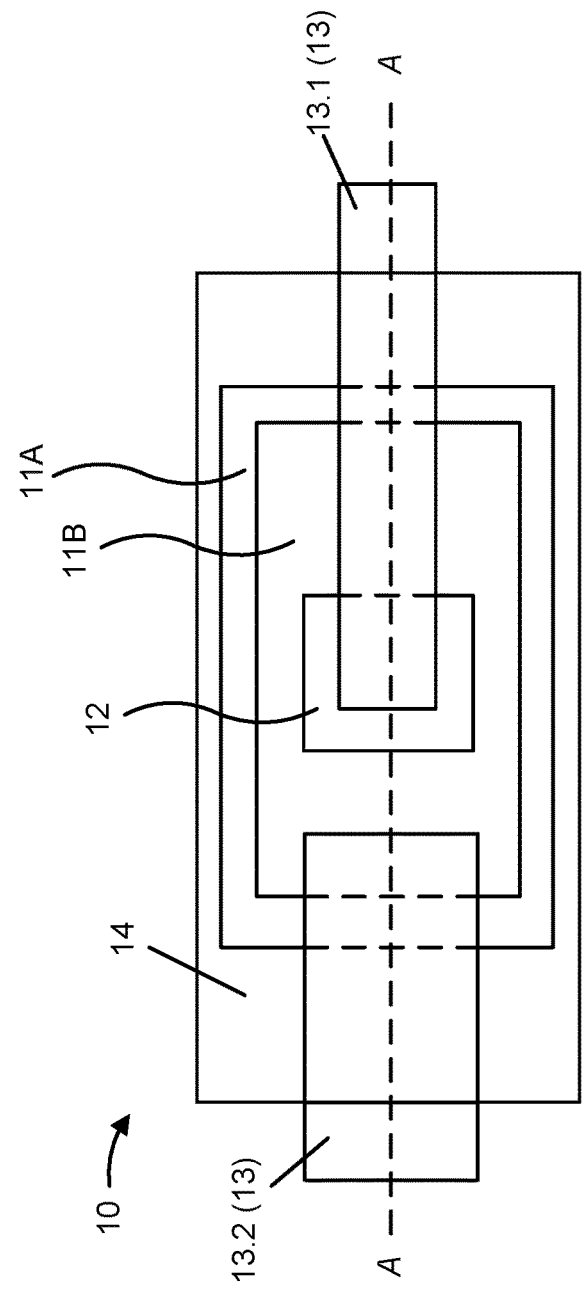
FIG. 1A
FIG. 1B

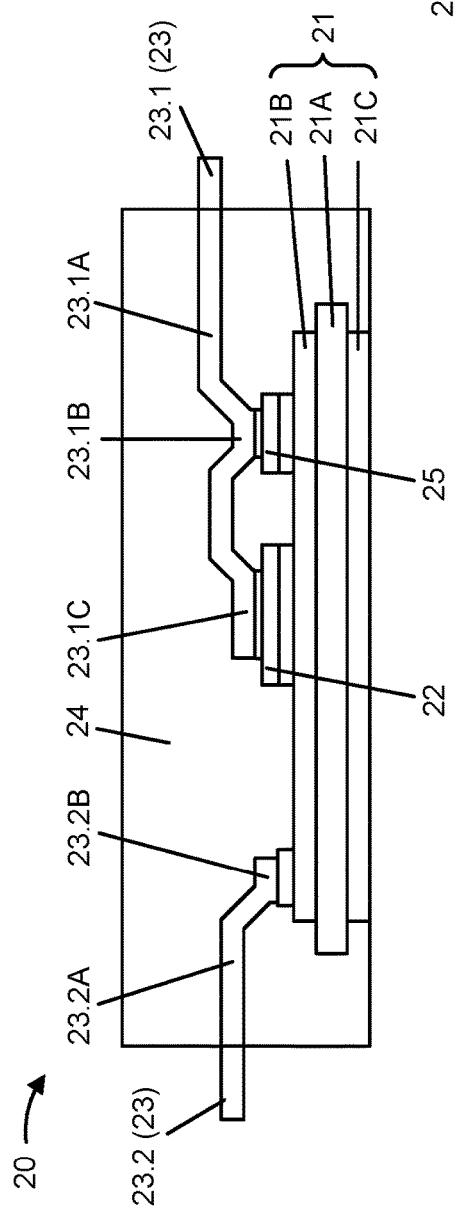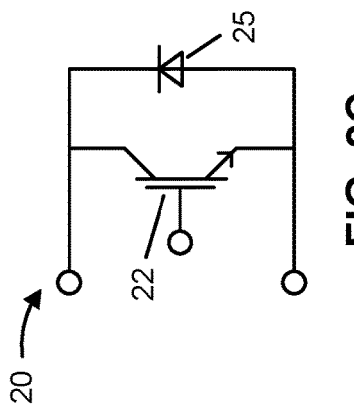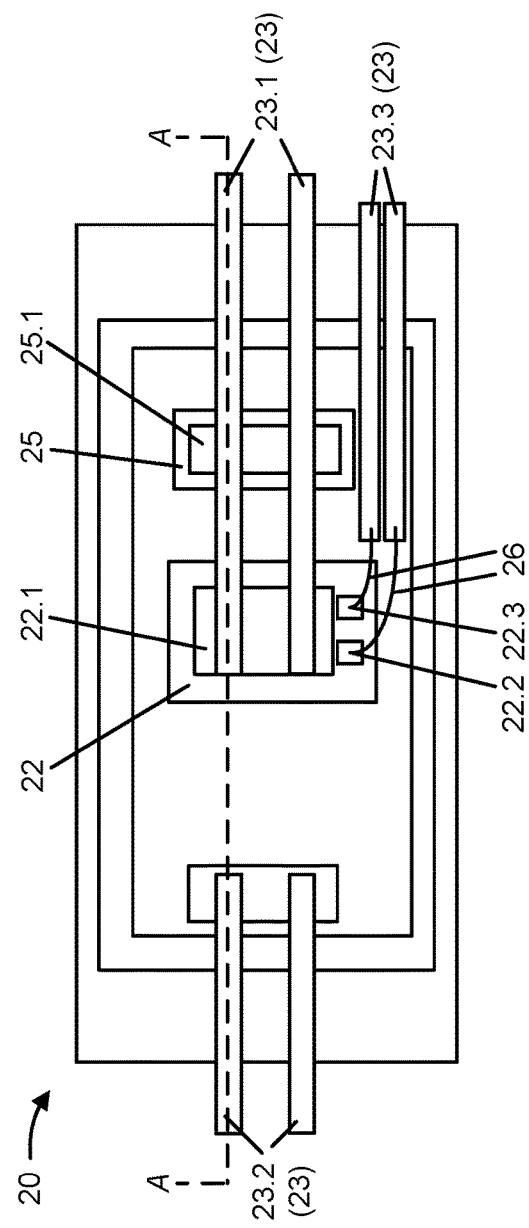

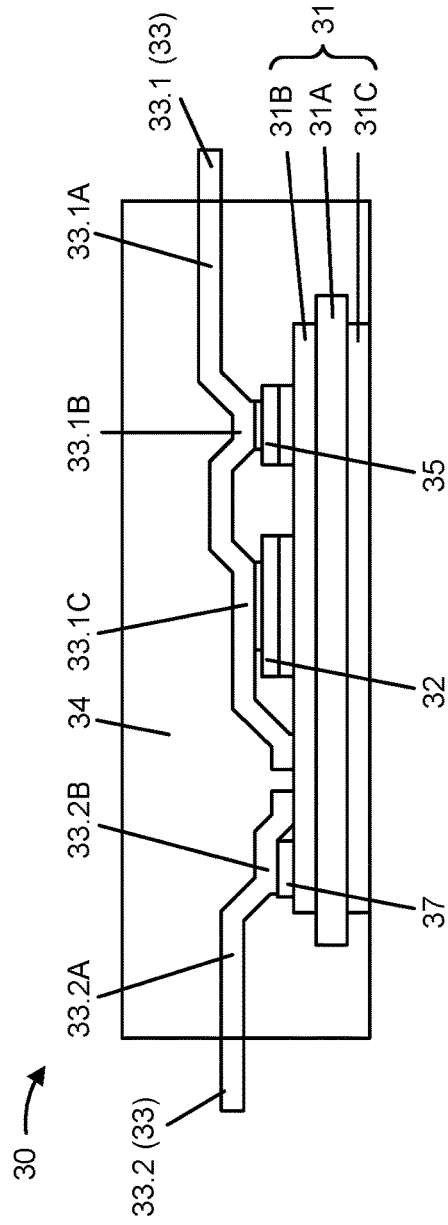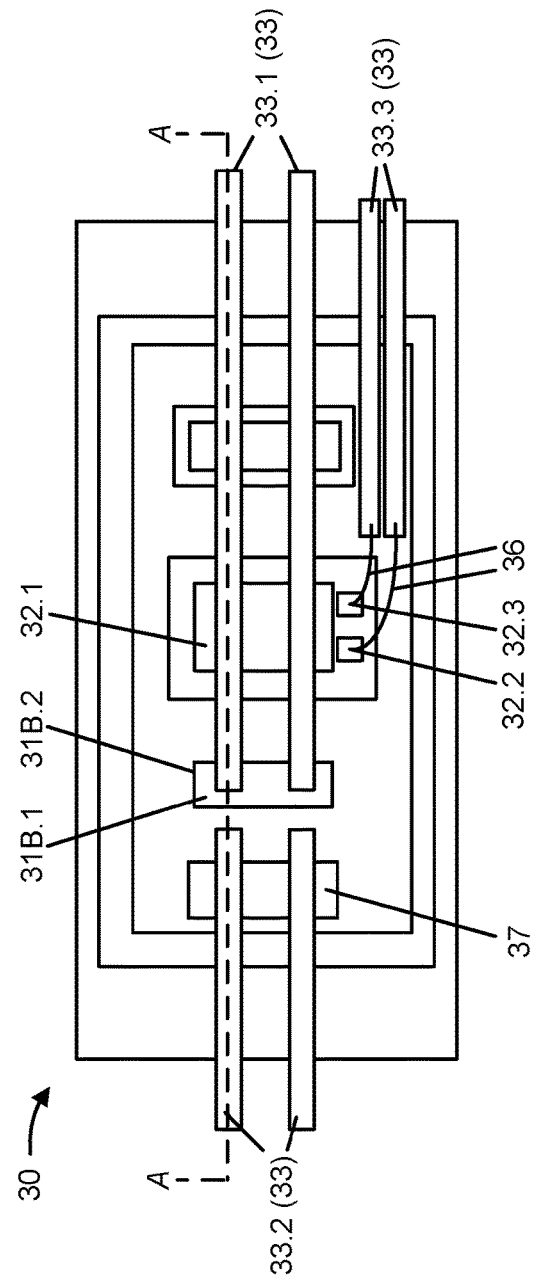

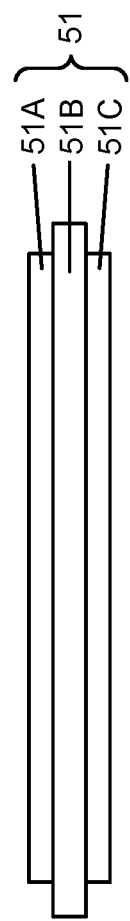
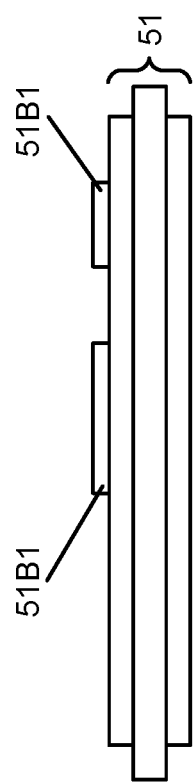

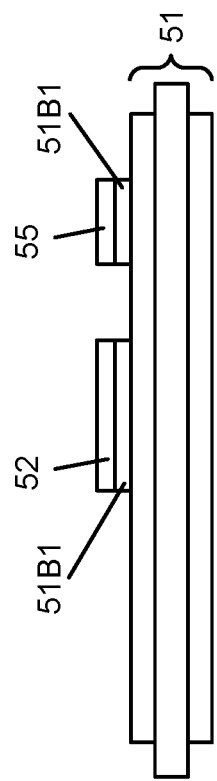
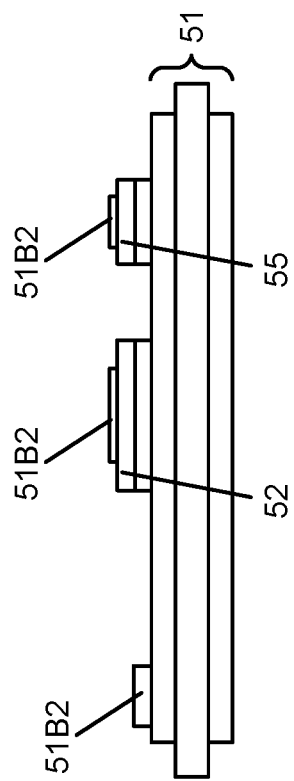

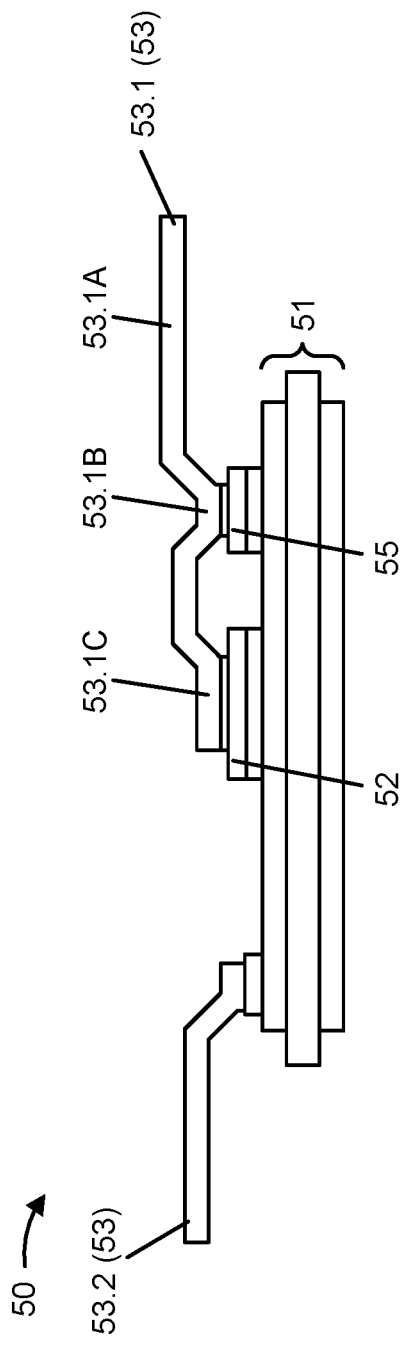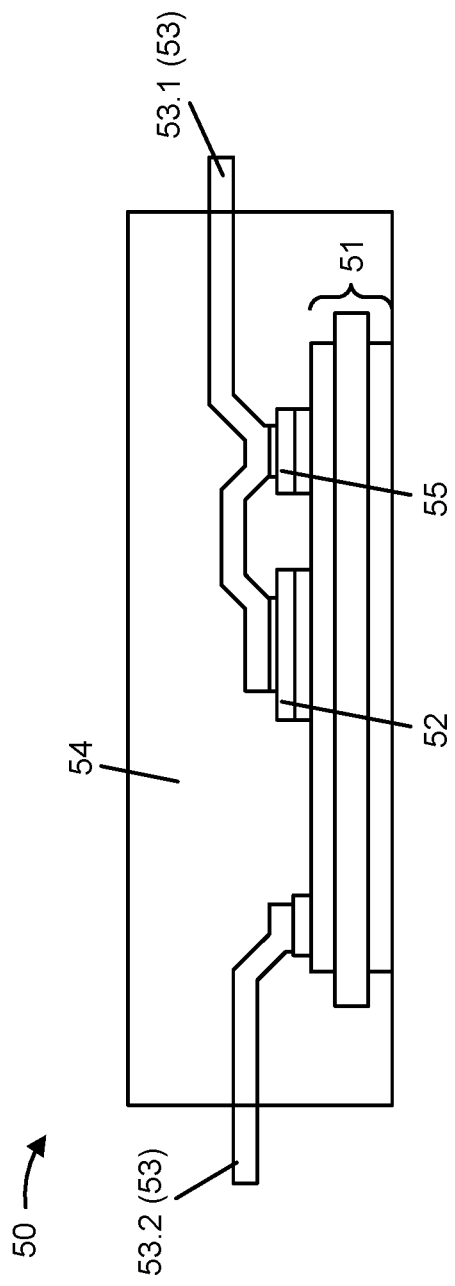

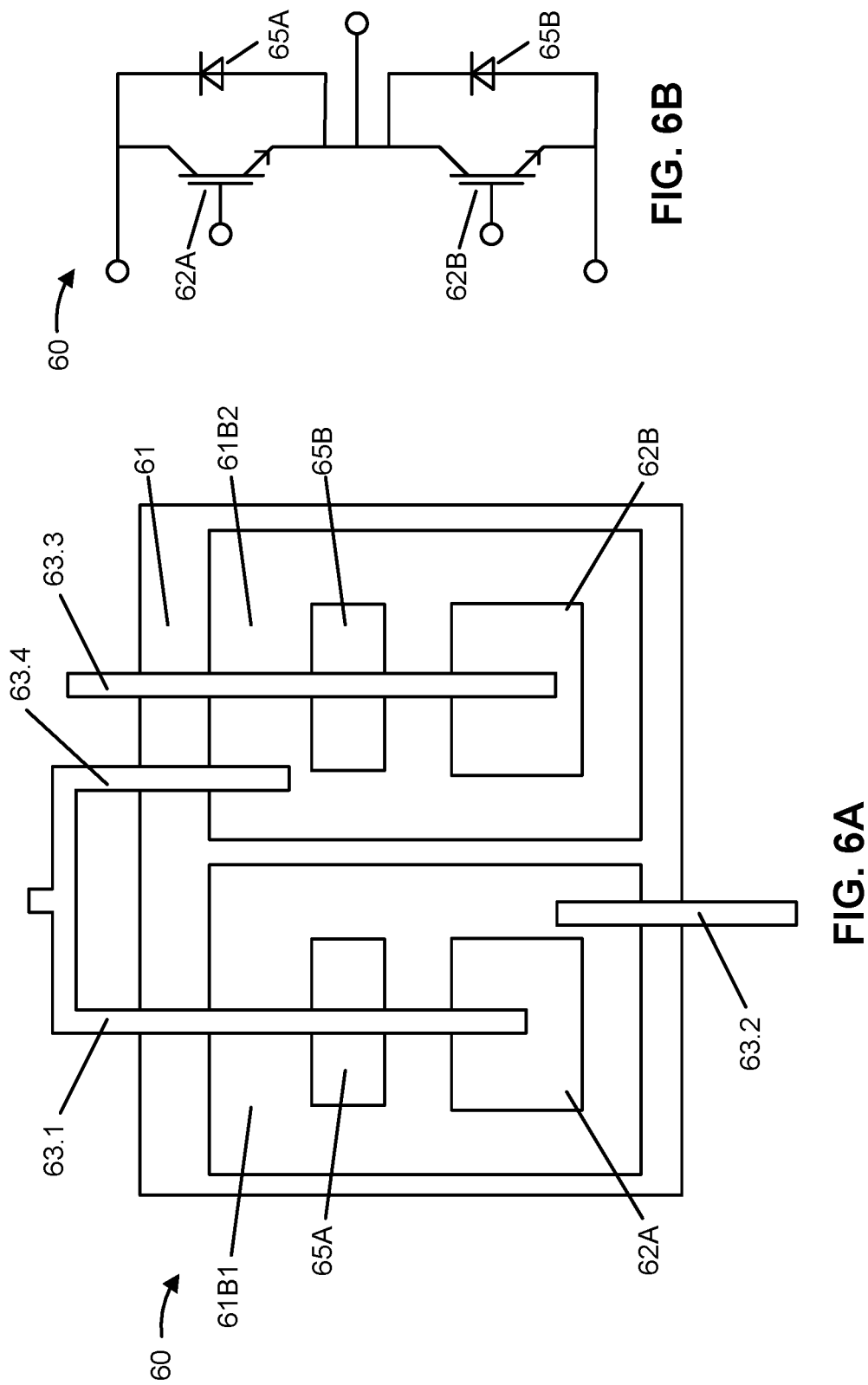

US 11,037,856 B2

SEMICONDUCTOR CHIP PACKAGE COMPRISING A LEADFRAME CONNECTED TO A SUBSTRATE AND A SEMICONDUCTOR CHIP, AND A METHOD FOR FABRICATING THE SAME

RELATED APPLICATION

This application is a divisional of U.S. patent application Ser. No. 15/724,920, filed Oct. 4, 2017, which is incorporated herein by reference.

TECHNICAL FIELD

The present disclosure relates to a semiconductor chip package, an electronic module, and a method for fabricating a semiconductor chip package.

BACKGROUND

In many electronic systems it is necessary to employ converters like DC/DC converters, AC/DC converters, or DC/AC converters in order to generate the currents and voltages to be used by an electronic circuit. A buck converter typically comprises one or more half-bridge circuits, each provided by two semiconductor power switches, such as power MOSFET devices, and further components such as diodes, inductors, and capacitors. An important aspect in development of these types of semiconductor chip packages is improvement of the connections between the different components within the package.

SUMMARY

According to some possible implementations, a semiconductor chip package, may include: a semiconductor chip disposed on a substrate, wherein the semiconductor chip has a first surface and a second surface, and wherein the first surface of the semiconductor chip is connected to the substrate; and a leadframe that includes a first lead and a second lead, wherein the first lead of the leadframe is directly attached to the second surface of the semiconductor chip, and wherein the second lead of the leadframe is directly attached to the substrate.

According to some possible implementations, a method for fabricating a semiconductor chip package may include: disposing a semiconductor chip on a substrate, wherein the semiconductor chip has a first surface and a second surface, and wherein the first surface of the semiconductor chip is connected to the substrate; attaching a first lead of a leadframe to the second surface of the semiconductor chip; and attaching second lead of the leadframe to the substrate.

According to some possible implementations, an electronic module may include: at least one semiconductor chip package comprising: a semiconductor chip disposed on a substrate, wherein a first surface of the semiconductor chip is connected to the substrate; and a leadframe that includes a first lead and a second lead, wherein the first lead of the leadframe is directly attached to a second surface of the semiconductor chip, and wherein the second lead of the leadframe is directly attached to the substrate.

The person skilled in the art recognizes additional features and advantages upon reading the following detailed description and upon giving consideration to the accompanying drawings.

BRIEF DESCRIPTION OF THE DRAWINGS

The accompanying drawings are included to provide a further understanding of examples and are incorporated in and constitute a part of this specification. The drawings illustrate examples and together with the description serve to explain principles of examples. Other examples and many of the intended advantages of examples will be readily appreciated as they become better understood by reference to the following detailed description.

The elements of the drawings are not necessarily to scale relative to each other. Like reference numerals designate corresponding similar parts.

FIGS. 1A and 1B show a schematic cross-sectional side view representation and a top view representation, respectively, of a semiconductor chip package according to an example in which a first lead is attached to a semiconductor chip and a second lead is attached to a substrate.

FIGS. 2A-2C show a schematic cross-sectional side view representation of a semiconductor chip package, a top view representation of a semiconductor chip package, and a circuit diagram of an electrical circuit, respectively, according to an example in which a first lead is attached to first and second semiconductor chips and a second lead is attached to a substrate.

FIGS. 3A and 3B and show a schematic cross-sectional side view representation and a top view representation, respectively, of a semiconductor chip package according to an example in which a first lead is attached to first and second semiconductor chips and a second lead is attached to a substrate, wherein the first and second leads are provided with additional features in order to enhance the stability of the connections.

FIGS. 5A-5F show schematic cross-sectional side view representations associated with an example of the method for fabricating a semiconductor chip package of FIG. 4.

FIGS. 6A and 6B show a schematic top view representation of a semiconductor chip package and a circuit diagram of an electrical circuit, respectively, according to another example in which four semiconductor chips are included in a semiconductor package in order to form a half-bridge circuit.

DETAILED DESCRIPTION

Figure 2D:
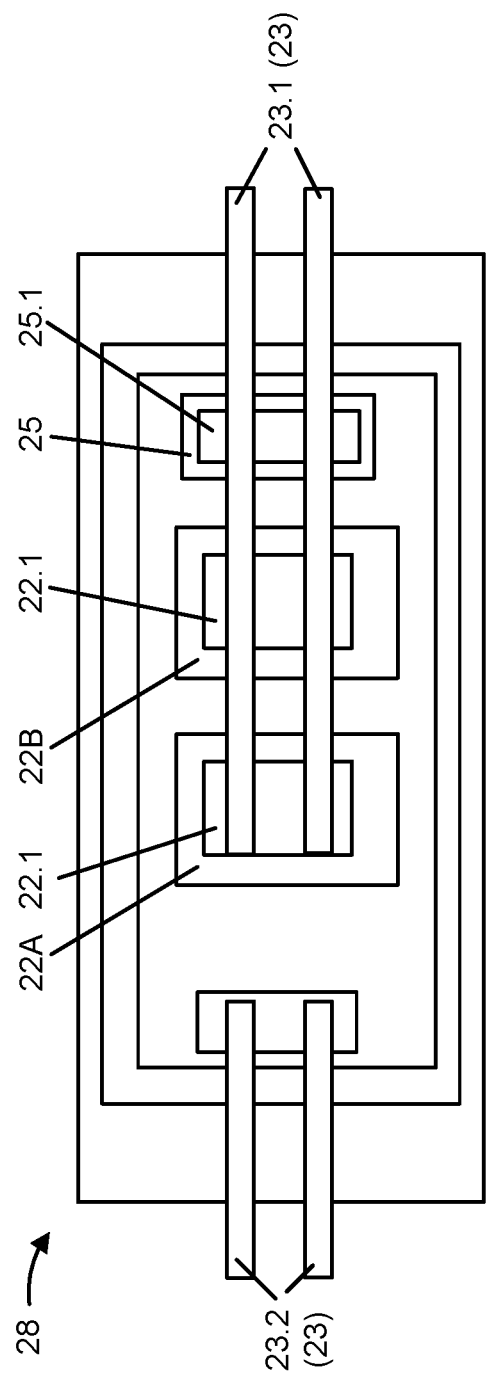
FIGS. 2D and 2E show a top view representation of a semiconductor chip package and a circuit diagram of an electrical circuit, respectively, according to another example in which example a first lead is attached to first, second, and third semiconductor chips and a second lead is attached to a substrate.

The aspects and examples are now described with reference to the drawings, wherein like reference numerals are generally utilized to refer to like elements throughout. In the following description, for purposes of explanation, numerous specific details are set forth in order to provide a thorough understanding of one or more aspects of the examples. It may be evident, however, to one skilled in the art that one or more aspects of the examples may be practiced with a lesser degree of the specific details. In other instances, known structures and elements are shown in schematic form in order to facilitate describing one or more aspects of the examples. It is to be understood that other examples may be utilized and structural or logical changes may be made without departing from the scope of the present disclosure. It should be noted further that the drawings are not to scale or not necessarily to scale.

In the following detailed description, reference is made to the accompanying drawings, which form a part hereof, and in which is shown by way of illustration specific aspects in which the disclosure may be practiced. In this regard, directional terminology, such as "top", "bottom", "front", "back" etc., may be used with reference to the orientation of the figures being described. Since components of described devices may be positioned in a number of different orientations, the directional terminology may be used for purposes of illustration and is in no way limiting. It is understood that other aspects may be utilized and structural or logical changes may be made without departing from the scope of the present disclosure. The following detailed description, therefore, is not to be taken in a limiting sense, and the scope of the present disclosure is defined by the appended claims.

In addition, while a particular feature or aspect of an example may be disclosed with respect to only one of several implementations, such feature or aspect may be combined with one or more other features or aspects of the other implementations as may be desired and advantageous for any given or particular application. Furthermore, to the extent that the terms "include", "have", "with" or other variants thereof are used in either the detailed description or the claims, such terms are intended to be inclusive in a manner similar to the term "comprise".

The terms "coupled" and "connected", along with derivatives may be used. It should be understood that these terms may be used to indicate that two elements co-operate or interact with each other regardless whether they are in direct connection with each other, or whether they are not in direct connection with each other. A direct connection can have the meaning of a positive or form-fitting connection of two elements. Also, even if two elements are described to be in direct connection with each other, there can still be a layer like, for example, a solder layer, a sinter layer or a glue layer between the two elements, which layer has only the function of effectuating and ensuring the connection between the two elements.

The semiconductor chip package according to one aspect comprises a substrate comprising an insulator layer covered with metallic layers on both of its main surfaces. According to an example, the insulator layer may comprise a ceramic material. According to a further example, the substrate can be a direct copper bonded (DCB) substrate, a direct aluminum bonded (DAB) substrate, or an active metal brazing (AMB) substrate. According to another example, the substrate can be an insulated metal substrate (IMS).

The examples of a semiconductor chip package comprise a first semiconductor chip which may comprise a transistor device. The transistor device may comprise a MOS transistor structure, a bipolar transistor structure or an IGBT (insulated gate bipolar transistor) structure of either polarity NPN or PNP, wherein those structures may be provided in a form in which at least one electrical contact element is arranged on a first main face of the semiconductor die and at least one other electrical contact element is arranged on a second main face opposite to the first main face of the semiconductor die (vertical transistor structures).

Notably, any of the semiconductor chip packages described herein may be associated with (e.g., included in) a power semiconductor product or another type of product that uses relatively high currents (e.g., as compared to a product that uses relatively low currents, such as a sensor, a microcontroller, and/or the like). For example, the leadframe configurations described herein may be used in place of wirebonding, which has difficulties carrying relatively large current densities, may result in damage to a semiconductor chip (e.g., when thick wirebonds are used), and/or may be cost prohibitive. In some implementations, the semiconductor chip(s), associated with a semiconductor chip package described herein, may be a power switch.

FIGS. 1A and 1B show a schematic cross-sectional side view representation and a top view representation, respectively, of a semiconductor chip package 10 according to an example in which a first lead is attached to a semiconductor chip and a second lead is attached to a substrate. The cross-sectional view of FIG. 1A has been taken along a plane indicated by line A-A in FIG. 1B.

The semiconductor chip package 10 comprises a substrate 11 comprising an insulator layer 11A and a first metallic layer 11B disposed on a first upper main face of the insulator layer 11A, and a second metallic layer 11C disposed on a second lower main face of the insulator layer 11A. According to an example, the substrate 11 can be a direct bonded copper (DCB) wherein the insulator layer 11A comprises a ceramic material, and the first and second metallic layers 11B and 11C are comprised of copper layers.

The semiconductor chip package 10 further comprises a first semiconductor chip 12 comprising a first surface (e.g., an upper main face) and a second surface (e.g., a lower main face), a first contact pad (not shown) disposed on the first surface, and a second contact pad (not shown) disposed on the second surface, wherein the first semiconductor chip 12 is disposed on the first metallic layer 11B of the substrate 11.

The semiconductor chip package 10 of FIG. 1 further comprises a leadframe 13 comprising a first lead 13.1 and a second lead 13.2, wherein the first lead 13.1 is attached to the first contact pad of the semiconductor chip 12 (e.g., such that the first lead 13.1 is connected to the first surface of the semiconductor chip 12 via the first contact pad), and the second lead 13.2 is attached to the first metallic layer 11B of the substrate 11.

The semiconductor chip package 10 of FIG. 1 further comprises an encapsulant 14 disposed on the substrate 11, the first semiconductor chip 12, and the leadframe 13.

As shown in the example of FIG. 1, the first lead 13.1 can be attached to the first contact pad of the semiconductor chip 12, and the second lead 13.2 can be the first metallic layer 11B of the substrate 11. Such attachment may be referred to herein as direct attachment. The attachments can be formed by, for example, soldering, sintering, or glue-die attach, which means that a solder layer, a sinter layer, or a glue layer can be provided between the first and second leads 13.1 and 13.2 and the semiconductor chip 12 and the substrate 11, respectively.

The semiconductor chip 12 can be a semiconductor transistor chip having a vertical structure, in particular an insulated gate bipolar transistor (IGBT) chip. The first contact pad of the semiconductor chip 12 can thus be an emitter contact pad located at the first surface of the semiconductor chip 12, and can be attached to the first lead 13.1. The second contact pad can be a collector contact pad located at the second surface of the semiconductor chip 12, and can be attached to the first metallic layer 11B of the substrate 11. The semiconductor chip 12 is thus connected in series between the first and second leads 13.1 and 13.2.

In some implementations, as shown in FIGS. 1A and 1B, the first lead 13.1 and the second lead 13.2 may each include a single lead. Alternatively, the first lead 13.1 and/or the second lead 13.2 may each include two or more leads, as will be shown in further examples below.

According to the example shown in FIGS. 1A and 1B, the first and second leads 13.1 and 13.2 are disposed on opposing side faces of the semiconductor chip package 10. It is, however, also possible to locate the first and second leads 13.1 and 13.2 at the same side face of the semiconductor chip package or at two adjacent side faces of the semiconductor chip package.

The material of the encapsulant 14 can be an electrically insulating material, such as a molding material, a resin material, or an epoxy material. The encapsulating material may also comprise one or more of the above-mentioned materials and, in some implementations, may include filler materials embedded therein, such as thermally conductive increments. These filler increments can be made of, for example, AlO or Al2O3, AlN, BN, or SiN.

As shown in the example of FIG. 1, the encapsulant 14 can be applied in such that the encapsulant 14 comprises a first lower main face and a second upper main face opposite to the first main face, and four side faces connecting the first and second main faces, wherein the first and second leads 13.1 and 13.2 extend through one or more of the side faces of the encapsulant 14. The first lower main face of the encapsulant 14 can be coplanar with the lower main face of the substrate 11 (i.e., with the lower main face of the second metallic layer 11C of the substrate 11).

The leadframe 13 may comprise further leads which, for purposes of clarity and simplicity, are not shown in FIGS. 1A and 1B and which may be connected with further contact pads of the semiconductor chip 12. There will be shown below further examples of semiconductor chip packages in which these further connections will be depicted.

The number, arrangement, thicknesses, and/or the like, of layers and elements shown in FIGS. 1A and 1B are provided as an example. In practice, the semiconductor chip package 10 may include additional layers and/or elements, fewer layers and/or elements, different layers and/or elements, or differently arranged layers and/or elements than those shown in FIGS. 1A and 1B.

FIGS. 2A-2C show a schematic cross-sectional side view representation of a semiconductor chip package 20, a top view representation of the semiconductor chip package 20, and a circuit diagram of an electrical circuit, respectively, according to an example in which a first lead is connected to first and second semiconductor chips and a second lead is connected to a substrate. The cross-sectional view as shown in FIG. 2A, has been taken along a plane indicated by line A-A in FIG. 2B.

The semiconductor chip package 20 comprises a substrate 21 which can be similar to the substrate 11 of the semiconductor chip package 10, namely comprising an insulator layer 21A covered by first and second metallic layers 21B and 21C on its upper and lower main faces.

The semiconductor chip package 20 further comprises a first semiconductor chip 22 which can be similar to the semiconductor chip 12 of the semiconductor chip package 10 and can likewise be attached with its second contact pad on its second surface (e.g., a lower main face) to the metallic layer 21B of the substrate 21.

The semiconductor chip package 20 further comprises a second semiconductor chip 25 which may comprise a first contact pad at a first surface (e.g., an upper main face) and a second contact pad at a second surface (e.g., a lower main face). The second semiconductor chip 25 can, for example, be a semiconductor diode chip which is connected with its second contact pad with the metallic layer 21B of the substrate 21.

The semiconductor chip package 20 further comprises a leadframe 23 comprising first leads 23.1 and second leads 23.2 (e.g., two separate first leads 23.1 and two separate second leads 23.2). The first leads 23.1 are attached to the upper electrical contact pads of the first and second semiconductor chips 22 and 25, respectively. In some implementations, as shown in FIG. 2B, the first lead 23.1 includes at least two leads that are aligned along substantially parallel directions (e.g., within approximately 5°). In particular, the first leads 23.1 are attached to the emitter contact pad 22.1 of the semiconductor transistor chip 22 and with the anode contact 25.1 of the semiconductor diode chip 25. The second leads 23.2 are attached to the first upper metallic layer 21B of the substrate 21. In some implementations, as shown in FIG. 2B, the second lead 23.2 includes at least two leads that are aligned along substantially parallel directions (e.g., within approximately 5°).

Here, the first and second semiconductor chips 22 and 25 are electrically connected in parallel between the first and second leads 23.1 and 23.2. If the first semiconductor chip 22 is a semiconductor transistor chip and the second semiconductor chip 25 is a semiconductor diode chip, then a circuit configuration is provided which is depicted in the circuit diagram of FIG. 2C. The circuit diagram shows the transistor 22 (e.g., included in the semiconductor transistor chip 22), and the diode 25 (e.g., included in the semiconductor diode chip 25). In some implementations, the diode 25 is provided to protect the transistor 22 against unwanted and unintentionally occurring peak voltages.

The cross-sectional view of FIG. 2A shows the connections between the elements in somewhat more detail. More specifically, the first and second semiconductor chips 22 and 25 are attached to the upper metallic layer 21B of the substrate 21 by means of a layer, in particular a solder layer, a sinter layer or a glue layer. The material of such a layer can be the same for the connections of the first and second semiconductor chips 22 and 25. In the case of soldering, a first solder material can be used for attaching the first and second semiconductor chips 22 and 25 to the upper metallic layer 21B of the substrate 21. Furthermore, layers are shown that connect the first leads 23.1 to the first upper contact pads of the first and second semiconductor chips 22 and 25, and a layer is shown that connects the second leads 23.2 to the upper metallic layer 21B of the substrate 21. Again, in the case of soldering, a second solder material can be used for these connections. The first and second solder materials may be different from each other, as described below.

The cross-sectional view of FIG. 2A also shows that both the first and second leads 23.1 and 23.2 comprise particular shapes that allow them to be connected to the first and second semiconductor chips 22 and 25 and the substrate 21, respectively. More specifically, the first leads 23.1 each comprise a first horizontal portion 23.1A nearer to a side face of the encapsulant 24, a second horizontal portion 23.1B nearer to a middle of the first lead 23.1, and a third horizontal portion 23.1C nearer to an end of the first lead 23.1, and deflections between the first horizontal portion 23.1A and the second horizontal portion 23.1B, and between the second horizontal portion 23.1B and the third horizontal portion 23.1C. The second and third horizontal portions 23.1B and 23.1C may be provided to make contact with their lower faces with the upper contact pads of the first and second semiconductor chips 22 and 25. Hence, the second and third horizontal portions 23.1B and 23.1C may be provided essentially on the same level if the first and second semiconductor chips 22 and 25 have equal thicknesses. The first horizontal portion 23.1A may have a higher level than the second and third horizontal portions 23.1B and 23.1C as the lead 23.1 has to be bent down from the first horizontal portion 23.1A down to the second horizontal portion 23.1B.

The second leads 23.2 may each comprise a first horizontal portion 23.2A nearer to a side face of the encapsulant 24 and a second lower horizontal portion 23.2B which makes contact with the upper metallic layer 21B of the substrate 21.

The leadframe 23 of the semiconductor chip package 20 of FIG. 2 may further comprise third leads 23.3 in order to make electrical contact with further contact pads of the first semiconductor chip 22. More specifically, in case of the first semiconductor chip 22 being an IGBT chip, the IGBT chip may comprise, on the first surface, an emitter contact pad 22.1, a gate contact pad 22.2, an emitter-sense contact pad 22.3, and/or the like. In this case the third leads 23.3 may include two third leads 23.3, one of which is electrically connected with the gate contact pad 22.2 and the other of which is electrically connected with the emitter-sense contact pad 22.3, whereas the first leads 23.1 are attached to the emitter contact pad 22.1 of the first semiconductor chip 22 and the anode contact pad of the diode 25.1, as described above. Both third leads 23.3 may be embedded in the encapsulant 24 in a manner similar to that of the first and second leads 23.1 and 23.2, and may extend through a side face of the encapsulant 24. In the example shown in FIG. 2B, the third leads 23.3 extend through the same side face of the encapsulant 24 as the first leads 23.1. It is likewise possible that the third leads 23.3 extend through any other one of the side faces of the encapsulant 24.

The third leads 23.3 can be connected via bond wires 26 with the gate contact pad 22.2 and the emitter-sense contact pad 22.3. Instead of bond wires, clips could be used for making the connections, wherein the clips could be soldered to the contact pads 22.2 and 22.3 and the third leads 23.3.

Figure 2E:
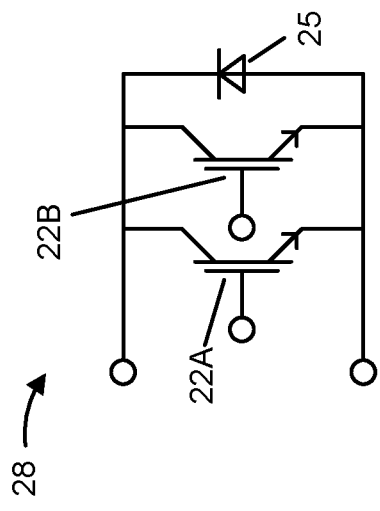

FIGS. 2D and 2E show a top view representation of a semiconductor chip package 28 and a circuit diagram of an electrical circuit, respectively, according to another example in which example a first lead is attached to first, second, and third semiconductor chips and a second lead is attached to a substrate.

Similar to the semiconductor chip package 20, the semiconductor chip package 28 comprises a substrate 21. As shown in FIG. 2D, the semiconductor chip package 28 further comprises a first semiconductor chip 22A (e.g., a first semiconductor transistor chip), a second semiconductor chip 22B (e.g., a second semiconductor transistor chip), and a third semiconductor chip 25 (e.g., a semiconductor diode chip), each of which can be attached to the substrate 21.

The semiconductor chip package 20 further comprises a leadframe 23 comprising first leads 23.1 and second leads 23.2 (e.g., two separate first leads 23.1 and two separate second leads 23.2). The first leads 23.1 are attached to the upper electrical contact pads of the first semiconductor chip 22A, the second semiconductor chip 22B, and the third semiconductor chip 25. In some implementations, as shown in FIG. 2D, the first lead 23.1 includes at least two leads that are aligned along substantially parallel directions (e.g., within approximately 5°). In particular, the first leads 23.1 are attached to the emitter contact pad 22.1 of the first semiconductor chip 22A, the emitter contact pad 22.1 of the second semiconductor chip 22B, and the anode contact 25.1 of the third semiconductor chip 25. The second leads 23.2 are attached to the first upper metallic layer 21B of the substrate 21. In some implementations, as shown in FIG. 2B, the second lead 23.2 includes at least two leads that are aligned along substantially parallel directions (e.g., within approximately 5°).

Here, the first semiconductor chip 22A, the second semiconductor chip 22B, and the third semiconductor chip 25 are electrically connected in parallel between the first and second leads 23.1 and 23.2. If the first semiconductor chip 22A is a first semiconductor transistor chip, the second semiconductor chip 22B is a second semiconductor transistor chip, and the third semiconductor chip 25 is a semiconductor diode chip, then a circuit configuration is provided which is depicted in the circuit diagram of FIG. 2E. The circuit diagram shows the transistor 22A (e.g., included in the first semiconductor transistor chip 22A), the transistor 22B (e.g., included in the second semiconductor transistor chip 22B), and the diode 25 (e.g., included in the semiconductor diode chip 25). In some implementations, the diode 25 is provided to protect the transistors 22A and 22B against unwanted and unintentionally occurring peak voltages.

In cross section, the connections between the elements may be similar to those as described above in connection with the semiconductor chip package 20.

In some implementations, the first and second leads 23.1 and 23.2 comprise particular shapes that allow them to be connected to the first semiconductor chip 22A, the second semiconductor chip 22B, and the third semiconductor chip 25 and the substrate 21, as described above.

The number, arrangement, thicknesses, and/or the like, of layers and elements shown in FIGS. 2A-2E are provided as examples. In practice, the semiconductor chip package 20 and/or the semiconductor chip package 28 may include additional layers and/or elements, fewer layers and/or elements, different layers and/or elements, or differently arranged layers and/or elements than those shown in FIGS. 2A-2E.

FIGS. 3A and 3B and show a schematic cross-sectional side view representation and a top view representation, respectively, of a semiconductor chip package 30 according to an example in which a first lead is attached to first and second semiconductor chips and a second lead is attached to a substrate, wherein the first and second leads are provided with additional features in order to enhance the stability of the connections. The cross-sectional view as shown in FIG. 3A, has been taken along a plane indicated by line A-A in FIG. 3B.

The semiconductor chip package 30 is similar to the semiconductor chip package 20, in particular with regard to the substrate 31 comprising insulator layer 31A and first and second metallic layers 31B and 31C, first and second semiconductor chips 32 and 35 and their respective connections with the first metallic layer 31B, the encapsulant 34 disposed on the substrate 31, and the leadframe 33 comprising first, second, and third leads 33.1, 33.2, and 33.3. The shape and configuration of the first and second leads 33.1 and 33.2, however, is different from the first and second leads 23.1 and 23.2 of the leadframe 23 of the semiconductor chip package 20. More specifically, the first and second leads 33.1 and 33.2 comprise additional features which further improve the connections to the first and second semiconductor chips 32 and 35 and the substrate 31.

As shown, the first lead 33.1 differs from the first lead 23.1 of FIG. 2 in that it extends beyond the first contact pad 32.1 of the first semiconductor chip 32 to the left (see FIG. 3B) and is then bent downwards onto the first metallic layer 31B of the substrate 31 (see FIG. 3A). As can be seen in FIG. 3B, the left end portions of the first leads 33.1 may extends below the upper surfaces of the first semiconductor chip 32 and the second semiconductor chip 35. In some cases, the left end portions of the first leads 33.1 may extend such that these portions rest on an island 31B.1 (e.g., a copper island) formed in the first metallic layer 31B, wherein the island 31B.1 is formed by etching a trench 31B.2 into the upper metallic layer 31B. In this way, a short-circuit between the emitter and collector of the first semiconductor chip 32 is avoided. The left end portions of the first leads 33.1 rest on and/or may be pressed against the first upper layer 31B and, thus, strengthen the connection of the first leads 33.1 to the first surface of the first semiconductor chip 32. In some implementations, after the encapsulant 34 is disposed on the semiconductor chip package 30, the left end portions of the first leads 33.1 may rest substantially on the substrate 31, meaning that one or more of the left end portions of the first leads 33.1 may rest on the substrate 31 and/or on a portion of the encapsulant 34 that flows between the left end portions and the substrate 31. In such a case, a thickness of the portion of the encapsulant 34 between the left end portions and the substrate 31 may be, for example, less than or equal to approximately 100 micrometers (μm).

Furthermore, the second leads 33.2 are connected to the first metallic layer 31B of the substrate 31 by a layer 37, which can be a solder layer, a sinter layer, a glue layer, and/or the like. The thickness of the layer 37 can be equal to, smaller than, or greater than the thickness of the second leads 33.2. The second leads 33.2 extend beyond the layer 37 to the right (see FIG. 3B) and are then bent downward so that the second leads 33.2 rest on the first metallic layer 31B (see FIG. 3A). The right end portions of the second leads 33.2 thus rest on and/or are pressed against the first metallic layer 31B such that the connections between the second leads 33.2 and the first metallic layer 31B are improved. In some implementations, after the encapsulant 34 is disposed on the semiconductor chip package 30, the right end portions of the second leads 33.2 may rest substantially on the substrate 31, meaning that one or more of the right end portions of the second leads 33.2 may rest on the substrate 31 and/or on a portion of the encapsulant 34 that flows between the right end portions and the substrate 31. In such a case, a thickness of the portion of the encapsulant 34 between the left end portions and the substrate 31 may be, for example, less than or equal to approximately 100 μm.

FIG. 3B also shows the gate contact pad 32.2 and the emitter-sense contact pad 32.3 which can be similar to the respective contact pads 22.2 and 22.3 of the semiconductor chip package 20.

FIG. 3A shows that the first leads 33.1 may comprise horizontal portions 33.1A, 33.1B, and 33.1C similar to the respective horizontal portions 23.1A, 23.1B, and 23.1C as shown in FIG. 2A. Likewise the second leads 33.2 may comprise horizontal portions 33.2A and 33.2B similar to the respective horizontal portions 23.2A and 23.2B as shown in FIG. 2.

It has already been mentioned above that the various connections between the chips and the substrate and between the leads and the chips and the substrate can be realized by soldered layers, sintered layers, glue layers, and/or the like. It should be added herewith that also a mix of different types of connection layers through the semiconductor chip package is possible. For example, the one or more semiconductor chips could be sintered to the first metallic layer of the substrate, and the first and second leads could be soldered to the one or more chips and the first metallic layer of the substrate.

The number, arrangement, thicknesses, and/or the like, of layers and elements shown in FIGS. 3A and 3B are provided as examples. In practice, the semiconductor chip package 30 may include additional layers and/or elements, fewer layers and/or elements, different layers and/or elements, or differently arranged layers and/or elements than those shown in FIGS. 3a and 3B.

Figure 4:
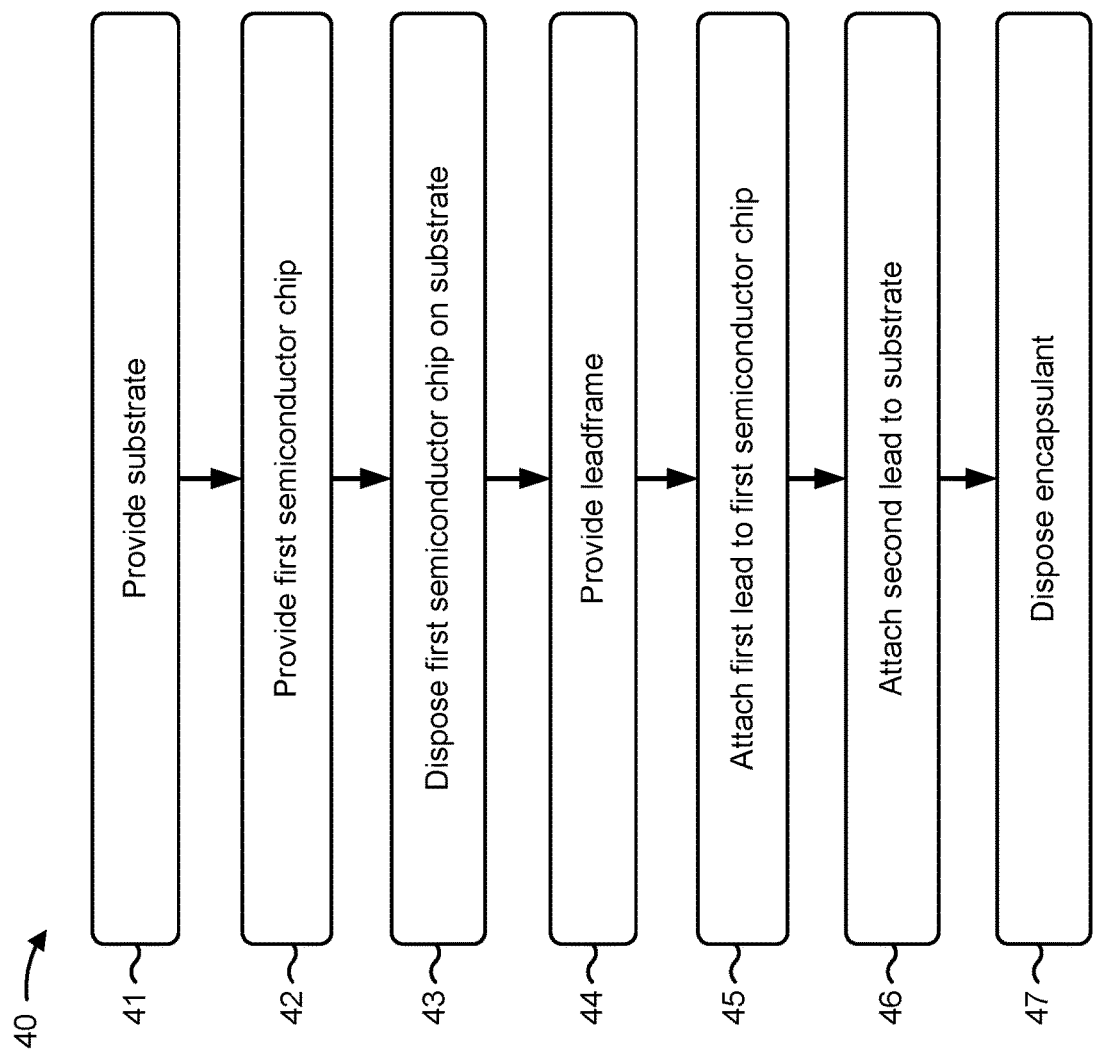
FIG. 4 shows a flow diagram for illustrating a method for fabricating a semiconductor chip package as described herein.

FIG. 4 shows a flow diagram for illustrating a method for fabricating a semiconductor chip package as described herein.

The method 40 of FIG. 4 comprises providing a substrate comprising, for example, an insulator layer and a first metallic layer disposed on a first upper main face of the insulator layer, and a second metallic layer disposed on a second lower main face of the insulator layer (41). As previously indicated and shown in the above examples, the substrate can be DCB in some implementations.

The method 40 further comprises providing a first semiconductor chip comprising a first surface (e.g., an upper main face) and a second surface (e.g., a lower main face) (42). In some implementations, a first contact pad may be disposed on the first surface, and a second contact pad may be disposed on the second surface. The first semiconductor chip can be a transistor chip having a vertical structure, such as an IGBT chip wherein the first contact pad is an emitter contact pad, and the second contact pad is a collector contact pad.

The method 40 further comprises disposing the first semiconductor chip on the substrate (43). This can be done, for example, by soldering, sintering, glue die attach, and/or the like. In case of soldering, a solder layer can be applied onto the upper surface of the first metallic layer by, for example, dispensing.

The method 40 further comprises providing a leadframe comprising a first lead and a second lead (44). The leadframe can be formed like one or more of the leadframes 13, 23, or 33 as described above. In some implementations, the leadframe may comprise at least two first leads and two second leads. In some implementations, the first and second lead or leads may be positioned at opposing side faces of the package to be fabricated.

The method 40 further comprises attaching the first lead to the first semiconductor chip (45). The attaching can be performed by, for example, soldering, sintering, glue die attaching, and/or the like. In the case of soldering, a solder layer can be applied onto the first contact pad of the first semiconductor chip and the first lead (e.g., a horizontal portion of the first lead) can be soldered onto the first contact pad by a solder reflow process.

The method 40 further comprises attaching the second lead to the substrate (46). The attaching can be performed in a manner similar to that as the attaching of the first lead with the first contact pad. In some implementations, the second lead of the leadframe may be attached to the substrate concurrently with the first lead of the leadframe being attached to the semiconductor chip (e.g., such that the first lead and the second lead are attached to the semiconductor chip and the substrate, respectively, during a same process step).

In some implementations, the first and second leads may be included in a single leadframe that is attached to one or more semiconductor chip packages (e.g., such that all leads of the leadframe are connected when attached to the one or more semiconductor chip packages). In such a case, after the one or more semiconductor chip packages are encapsulated, as described below, the leadframe may be trimmed (e.g., such that at least the first leads and the second leads are no longer connected).

The method 40 further comprises disposing an encapsulant on the substrate, the first semiconductor chip, and the leadframe (47). In some implementations, the encapsulant may be disposed using compression molding, transfer molding, injection molding, and/or the like.

According to an example of the method 40, connecting the first and second leads with the first contact pad and with the first metallic layer of the substrate, respectively, is performed concurrently, as described above.

According to an example of the method 40, the method further comprises providing a second semiconductor chip having a third surface (e.g., an upper main face) and a fourth surface (e.g., a lower main face), disposing the second semiconductor chip on the substrate, and attaching the first lead to the fourth surface of the second semiconductor chip. In some aspects, the second semiconductor chip can be diode chip (e.g., wherein a first contact pad is an anode contact pad and a second contact pad is a cathode contact pad). According to a further example thereof, attaching the first lead to the second semiconductor chip, attaching the first lead to the first semiconductor chip, and attaching the second lead to the substrate, may be performed concurrently. Such examples will be shown in somewhat more detail further below.

Although FIG. 4 shows example blocks of method 40, in some implementations, method 40 may include additional blocks, fewer blocks, different blocks, or differently arranged blocks than those depicted in FIG. 4. Additionally, or alternatively, two or more of the blocks of method 40 may be performed in parallel.

FIGS. 5A-5F show schematic cross-sectional side view representations associated with an example 50 of the method 40 for fabricating a semiconductor chip package.

According to FIG. 5A, a substrate 51 is provided, wherein substrate 51 comprises an insulator layer 51A, a first upper metallic layer 51B, and a second lower metallic layer 51C. The substrate 51 can be, for example, a direct bonded copper (DCB), wherein the insulator layer 51A is a ceramic-based material, and the first and second metallic layers 51B and 51C are copper layers.

According to FIG. 5B, solder layers 51B1 of a first solder material comprising a first melting point of, for example 300° C., are applied onto the first metallic layer 51B at positions at which the first and second semiconductor chips are to be attached.

According to FIG. 5C, first and second semiconductor chips 52 and 55 are attached to the substrate. For example, the first and second semiconductor chips 52 and 55 may be soldered on the solder layers 51B1 by a reflow process that includes applying a temperature that is higher than the first melting temperature and, thereafter, cooling down. The first semiconductor chip 52 can, for example, be an IGBT chip that is connected with its collector contact pad on its lower main face to the solder layer 51B1, and the second semiconductor chip 55 can, for example, be a semiconductor diode chip which is connected with its lower electrode (anode) contact pad to the solder layer 51B1.

According to FIG. 5D, second solder layers 51B2 are applied onto upper surfaces of the first and second semiconductor chips 52 and 55. The second solder layers 51B2 are made of a second solder material which is different from the first solder material, in particular which comprises a second melting point that is lower than the first melting point of the first solder material. The second melting point can be, for example, 250° C. The second solder layers 51B2 are applied onto the emitter contact pad of the IGBT chip 52 and onto the upper electrode (cathode) pad of the diode chip 55.

According to FIG. 5E, a leadframe 53 comprising one or more first leads 53.1 and one or more second leads 53.2 (e.g., as shown in FIGS. 2A-2E, FIGS. 3A and 3B, and/or the like), are attached to the first and second semiconductor chips 52 and 55. More specifically, the first leads 53.1 comprise three horizontal portions, a first horizontal portion 53.1A at the right end portion, and second horizontal and third horizontal portions 53.1B and 53.1C wherein the third horizontal portion 53.1C is located at the left end portion and the second horizontal portion 53.1B is located in between the first and third horizontal portions 53.1A and 53.1C. The second and third horizontal portions 53.1B and 53.1C are placed onto the second solder layers 51B2 on the upper contact pads of the first and second semiconductor chips 52 and 55, and the second leads 53.2 are placed onto the second solder layers 51B2 on the first metallic layer 51B. Then a reflow process is performed by applying a temperature above the second melting temperature (but not above the first melting point) followed by a cooling down with the result that the first and second leads 53.1 and 53.2 are directly attached to the first and second semiconductor chips 52 and 55 and the substrate, respectively.

According to FIG. 5F, an encapsulant 54 is applied to the substrate 51, the first and second semiconductor chips 52 and 55, and the leadframe 53.

As indicated above, FIGS. 5A-5F are provided merely as examples. Other examples are possible and may differ from what was described with regard to FIGS. 5A-5F.

FIGS. 6A and 6B show a schematic top view representation of a semiconductor chip package 60 and a circuit diagram of an electrical circuit, respectively, according to another example in which four semiconductor chips are included in a semiconductor package in order to form a half-bridge circuit.

The semiconductor chip package 60 may comprise a substrate 61 that is similar to the substrate 21 of the semiconductor chip package 20. However, as shown in FIG. 6A, the substrate 61 may include separate upper metallic layers 61B1 and 61B2 (e.g., rather than a single upper metallic layer 21B as shown with respect to, for example, the semiconductor chip package 20) that are electrically isolated from each other. As shown in FIG. 6A, the semiconductor chip package 60 further comprises a first semiconductor chip 62A (e.g., a first semiconductor transistor chip), a second semiconductor chip 65A (e.g., a first semiconductor diode chip), a third semiconductor chip 62B (e.g., a second semiconductor transistor chip), and a fourth semiconductor chip 65B (e.g., a second semiconductor diode chip), each of which can be attached to the substrate 61.

The semiconductor chip package 60 further comprises a leadframe 63 comprising a first lead 63.1, a second lead 63.2, a third lead 63.3 and a fourth lead 63.4. In some implementations, one or more of the first lead 63.1, the second lead 63.2, the third lead 63.3, and/or the fourth lead 63.4 may include separate (e.g., parallel) leads, as described above. As shown, the first lead 63.1 is attached to the first semiconductor chip 62A and the second semiconductor chip 65A. As shown, the second lead 63.2 is attached to the first upper metallic layer 61B1 of the substrate 61. As further shown, the third lead 63.3 is attached to the third semiconductor chip 62B and the fourth semiconductor chip 65B. As shown, the fourth lead 63.4 is attached to the first upper metallic layer 61B2 of the substrate 61. In some implementations, as shown in FIG. 6A, the first lead 63.1 is connected to the fourth lead 63.4 in order to form a half-bridge circuit between the first semiconductor chip 62A, the second semiconductor chip 65A, the third semiconductor chip 62B, and the fourth semiconductor chip 65B. In some implementations, the first lead 63.1 may be connected to the fourth lead 63.4 within the semiconductor chip package 60, as shown in FIG. 6A. Alternatively, the first lead 63.1 may be connected to the fourth lead 63.4 outside of the semiconductor chip package 60.

Here, the first semiconductor chip 62A, the second semiconductor chip 65A, the third semiconductor chip 62B, and the fourth semiconductor chip 65B are electrically connected in parallel between the first lead 63.1, the second lead 63.2, the third lead 63.3, and the fourth lead 63.4. If the first semiconductor chip 62A is a first semiconductor transistor chip, the second semiconductor chip 65A is a first semiconductor diode chip, the third semiconductor chip 62B is a second semiconductor transistor chip, and the fourth semiconductor chip 65B is a semiconductor diode chip, then a circuit configuration is provided which is depicted in the circuit diagram of FIG. 6B. The circuit diagram shows the transistor 62A (e.g., included in the first semiconductor transistor chip 62A) connected in parallel with the diode 65A (e.g., included in the first semiconductor diode chip 65A), and the transistor 62B (e.g., included in the second semiconductor transistor chip 62B) connected in parallel with the diode 65B (e.g., included in the second semiconductor diode chip 65B). In some implementations, the diodes 65A and 65B are provided to protect the transistors 62A and 62B against unwanted and unintentionally occurring peak voltages.

In cross section, the connections between the elements may be similar to those as described above in connection with the semiconductor chip package 20. Further, in some implementations, the first lead 63.1, the second lead 63.2, the third lead 63.3, and the fourth lead 63.4 comprise particular shapes that allow them to be connected to the respective semiconductor chips in the manner described above.

The number, arrangement, thicknesses, and/or the like, of layers and elements shown in FIGS. 6A and 6B are provided as examples. In practice, the semiconductor chip package 60 may include additional layers and/or elements, fewer layers and/or elements, different layers and/or elements, or differently arranged layers and/or elements than those shown in FIGS. 6A and 6B.

Figure 7A:
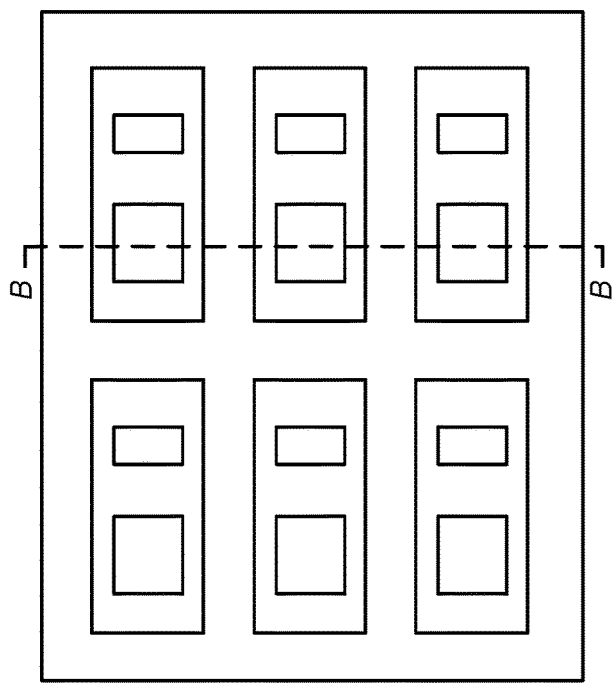
FIGS. 7A and 7B show a schematic top view representation and a schematic cross-sectional side view representation, respectively, of an example electronic module that comprises six semiconductor chip packages, as described herein.
Figure 7B:
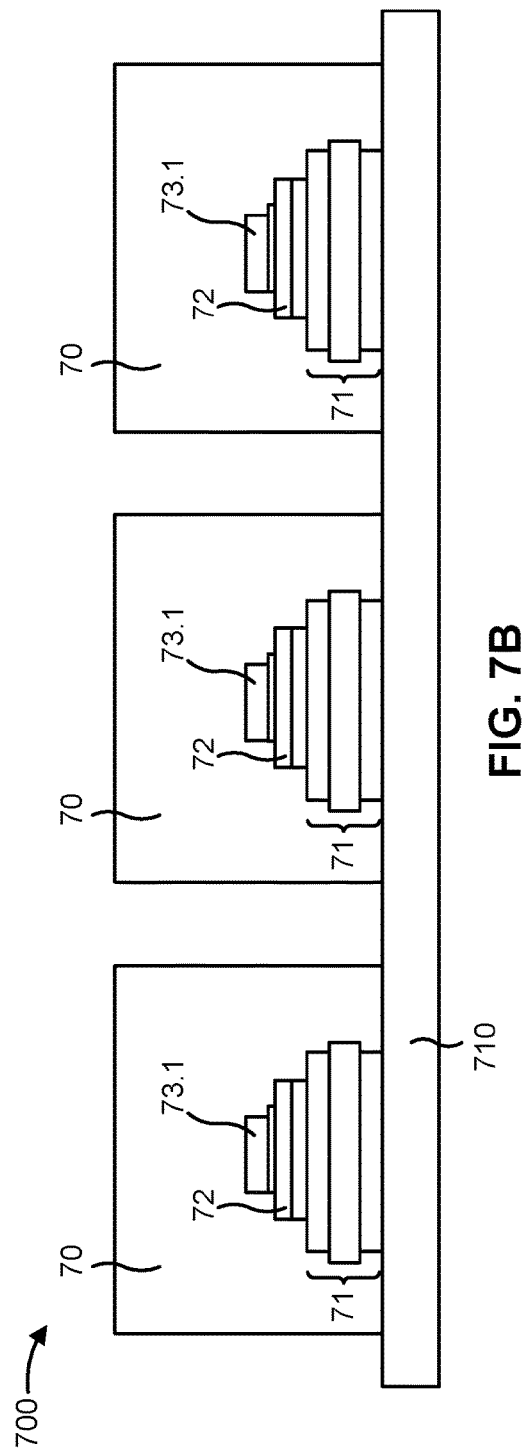

FIGS. 7A and 7B show a schematic top view representation and a schematic cross-sectional side view representation, respectively, of an example electronic module 700 that comprises six semiconductor chip packages, as described herein.

The cross-sectional side view representation as shown in FIG. 7B, has been taken along a plane indicated by line B-B in FIG. 7A.

FIG. 7A shows an electronic module 700 in a top view representation. The electronic module 700 comprises six semiconductor chip packages 70 each of which may comprise a structure of a semiconductor chip package as described herein. For purposes of clarity, only some elements of the semiconductor chip package 70 are shown in FIG. 7B. Here the substrate 71 can be similar to the substrates 11, 21, 31, and 51 of the previous examples, the first semiconductor chip 72 can be similar to the first semiconductor chips 12, 22, 32, and 52 of the previous examples, and the first lead 73.1 can be similar to the first leads 13.1, 23.1, 33.1, and 53.1 of the previous examples.

In some implementations, the semiconductor chip packages 70 can be electrically connected with each other. For example, when looking at FIG. 7A, it can be the case that each two semiconductor chip packages 70 (e.g., arranged laterally adjacent to each other) can be connected in order to form a half-bridge circuit. Thus, in some implementations, the electronic module 700 may comprise three half-bridge circuits. Such an electronic module 700 can be used, for example, for driving a 3-phase motor.

In some implementations, the backside of the electronic module 700 can be actively cooled. In particular, the semiconductor chip packages 70 can be mounted on a cooling substrate 710 which can be, for example, a hollow metallic cooling box via which a cooling medium is to flow.

The number, arrangement, thicknesses, and/or the like, of layers, elements, and semiconductor chip packages shown in FIGS. 7A and 7B are provided as examples. In practice, the electronic module 700 may include additional layers, elements, and/or semiconductor chip packages, fewer layers, elements, and/or semiconductor chip packages, different layers, elements, and/or semiconductor chip packages, or differently arranged layers, elements, and/or semiconductor chip packages than those shown in FIGS. 7A and 7B.

In some implementations, a semiconductor chip package may include a semiconductor chip disposed on a substrate, wherein the semiconductor chip has a first surface and a second surface, and wherein the first surface of the semiconductor chip is connected to the substrate; and a leadframe that includes a first lead and a second lead, wherein the first lead of the leadframe is directly attached to the second surface of the semiconductor chip, and wherein the second lead of the leadframe is directly attached to the substrate.

In some implementations, the semiconductor chip is a power switch.

In some implementations, the first lead includes at least two leads that are aligned along substantially parallel directions.

In some implementations, the second lead includes at least two leads that are aligned along substantially parallel directions.

In some implementations, the semiconductor chip is a first semiconductor chip and a first portion of the first lead is directly attached to the second surface of the first semiconductor chip, and wherein the semiconductor chip package further comprises a second semiconductor chip having a third surface and a fourth surface, wherein the third surface of the second semiconductor chip is connected to the substrate, and wherein a second portion of the first lead is directly attached to the fourth surface of the second semiconductor chip.

In some implementations, the first semiconductor chip is a transistor and the second semiconductor chip is a diode, wherein the diode is electrically connected in parallel with the transistor.

In some implementations, a third portion of the first lead extends below the second and fourth surfaces towards the substrate.

In some implementations, the semiconductor chip package further comprises a third semiconductor chip having a fifth surface and a sixth surface, wherein the fifth surface of the third semiconductor chip is connected to the substrate, and wherein a third portion of the first lead is directly attached to the sixth surface of the third semiconductor chip.

In some implementations, the first semiconductor chip is a first transistor, the second semiconductor chip is a second transistor, and the third semiconductor chip is a diode, wherein the first transistor is connected in parallel with the second transistor and the diode, and wherein the second transistor is connected in parallel with the diode.

In some implementations, the first surface of the first semiconductor chip, the second lead, and the third surface of the second semiconductor chip are connected to a first portion of the substrate, and wherein the semiconductor chip package further comprises: a third semiconductor chip having a fifth surface and a sixth surface, wherein the fifth surface of the third semiconductor chip is connected to a second portion of the substrate, wherein a first portion of a third lead of the leadframe is directly attached to the sixth surface of the third semiconductor chip; and a fourth semiconductor chip having a seventh surface and an eighth surface, wherein the seventh surface of the fourth semiconductor chip is connected to the second portion of the substrate, wherein a second portion of the third lead is directly attached to the eighth surface of the fourth semiconductor chip, wherein the first portion of the substrate and the second portion of the substrate are electrically isolated from each other.

In some implementations, a fourth lead of the leadframe is directly attached to the second portion of the substrate, wherein the fourth lead is connected to the first lead.

In some implementations, the first semiconductor chip is a first transistor, the second semiconductor chip is a first diode, the third semiconductor chip is a second transistor, and the fourth semiconductor chip is a second diode, wherein the first transistor is electrically connected in parallel with the first diode, and wherein the second transistor is electrically connected in parallel with the second diode.

In some implementations, the first semiconductor chip, the second semiconductor chip, the third semiconductor chip, and the fourth semiconductor chip are connected to form a half-bridge circuit.

In some implementations, a method for fabricating a semiconductor chip package may include disposing a semiconductor chip on a substrate, wherein the semiconductor chip has a first surface and a second surface, and wherein the first surface of the semiconductor chip is connected to the substrate; attaching a first lead of a leadframe to the second surface of the semiconductor chip; and attaching second lead of the leadframe to the substrate.

In some implementations, the method may include disposing an encapsulant on the substrate, the semiconductor chip, and a portion of the leadframe.

In some implementations, at least one of the first lead and the second lead includes at least two leads that are aligned along substantially parallel directions.

In some implementations, the first lead of the leadframe is attached to the second surface of the semiconductor chip concurrently with the second lead of the leadframe being attached to the substrate.

In some implementations, the semiconductor chip is a power switch.

In some implementations, the semiconductor chip is a first semiconductor chip and a first portion of the first lead is attached to the second surface of the first semiconductor chip, and wherein the method further comprises: disposing a second semiconductor chip on the substrate, wherein the second semiconductor chip has a third surface and a fourth surface, and wherein the third surface of the semiconductor chip is connected to the substrate; and attaching a second portion of the first lead to the fourth surface of the second semiconductor chip.

In some implementations, an electronic module may include at least one semiconductor chip package comprising: a semiconductor chip disposed on a substrate, wherein a first surface of the semiconductor chip is connected to the substrate; and a leadframe that includes a first lead and a second lead, wherein the first lead of the leadframe is directly attached to a second surface of the semiconductor chip, and wherein the second lead of the leadframe is directly attached to the substrate.

While the disclosure has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the disclosure. The foregoing disclosure provides illustration and description, but is not intended to be exhaustive or to limit the implementations to the precise form disclosed. Modifications and variations are possible in light of the above disclosure or may be acquired from practice of the implementations.

The foregoing disclosure provides illustration and description, but is not intended to be exhaustive or to limit the implementations to the precise form disclosed. Modifications and variations are possible in light of the above disclosure or may be acquired from practice of the implementations.

Even though particular combinations of features are recited in the claims and/or disclosed in the specification, these combinations are not intended to limit the disclosure of possible implementations. In fact, many of these features may be combined in ways not specifically recited in the claims and/or disclosed in the specification. Although each dependent claim listed below may directly depend on only one claim, the disclosure of possible implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Furthermore, as used herein, the term "set" is intended to include one or more items (e.g., related items, unrelated items, a combination of related and unrelated items, etc.), and may be used interchangeably with "one or more." Where only one item is intended, the term "one" or similar language is used. Also, as used herein, the terms "has," "have," "having," or the like are intended to be open-ended terms. Further, the phrase "based on" is intended to mean "based, at least in part, on" unless explicitly stated otherwise.

What is claimed is:

1. A method for fabricating a semiconductor chip package, the method comprising:
   disposing a first semiconductor chip on a substrate,
   wherein the first semiconductor chip has a first surface and a second surface, and
   wherein the first surface is connected to the substrate;
   disposing a second semiconductor chip on the substrate,
   wherein the second semiconductor chip has a third surface and a fourth surface, and
   wherein the third surface is connected to the substrate;

attaching a first portion of a first lead of a leadframe directly to the second surface;

attaching a second lead of the leadframe directly to the substrate, wherein the first lead and the second lead are connected by the leadframe when the second lead is attached to the substrate, and wherein the first lead is attached to the second surface concurrently with the second lead being attached to the substrate; and attaching a second portion of the first lead directly to the fourth surface.

2. The method of claim 1, further comprising disposing an encapsulant on the substrate, the first semiconductor chip, the second semiconductor chip, and a portion of the leadframe.

3. The method of claim 1, wherein at least one of the first lead or the second lead includes at least two leads that are aligned along substantially parallel directions.

4. The method of claim 1, wherein the first semiconductor chip and/or the second semiconductor chip is a power switch.

5. The method of claim 1, wherein the first semiconductor chip is a transistor and the second semiconductor chip is a diode, wherein the diode is electrically connected in parallel with the transistor.

6. The method of claim 1, wherein a third portion of the first lead extends below the second and fourth surfaces towards the substrate.

7. The method of claim 1, further comprising:

trimming the leadframe after attaching the second lead to the substrate such that the first lead and the second lead are no longer connected by the leadframe.

8. The method of claim 1, further comprising:

disposing an encapsulant on the substrate, the first semiconductor chip, the second semiconductor chip, and a portion of the leadframe, wherein the encapsulant is disposed such that the first lead extends through a first side face of the encapsulant, and wherein the encapsulant is disposed such that the second lead extends through a second side face of the encapsulant.

9. The method of claim 8, wherein the first side face and the second side face are on opposite sides of the encapsulant.

10. The method of claim 8, wherein an outlead of the first lead, which extends through the first side face of the encapsulant, is integral with an attached portion of the first lead, which is attached to the first semiconductor chip.

11. The method of claim 8, wherein an outlead of the second lead, which extends through the second side face of the encapsulant, is integral with an attached portion of the second lead, which is attached to the substrate.

12. The method of claim 8, wherein the first lead and the second lead are separated with respect to a particular direction, wherein the second lead includes a first portion that extends through the second side face of the encapsulant, wherein the second lead includes a second portion that attaches to the substrate, wherein the first portion of the second lead and the second portion of the second lead extend in the particular direction, and wherein the first portion of the second lead is further away from the substrate than the second portion of the second lead is to the substrate.

13. The method of claim 1, further comprising:

connecting a third lead of the leadframe to a contact pad of the first semiconductor chip.

14. The method of claim 13, wherein connecting the third lead to the contact pad comprises:

connecting the third lead to the contact pad via a bond wire or a clip.

15. The method of claim 1, wherein attaching the first portion of the first lead directly to the second surface comprises:

attaching the first portion of the first lead to an emitter contact pad of the first semiconductor chip.

16. The method of claim 1, wherein attaching the second portion of the first lead directly to the fourth surface comprises:

attaching the second portion of the first lead to an anode contact pad of the first semiconductor chip.

17. The method of claim 1, wherein the substrate comprises:

an insulator layer;

a first metallic layer disposed on a first surface of the insulator layer; and a second metallic layer disposed on a second surface of the insulator layer.

18. The method of claim 1, wherein disposing the first semiconductor chip on the substrate comprises:

applying a first solder material to a metallic surface of the substrate; and soldering the first semiconductor chip on the first solder material; and wherein attaching the first portion of the first lead directly to the second surface comprises:

applying a second solder material to the second surface; and soldering the first portion of the first lead on the second solder material.

19. The method of claim 18, wherein attaching the second lead of the leadframe directly to the substrate comprises:

applying the second solder material to the metallic surface of the substrate; and soldering the second lead to the second solder material.

20. The method of claim 1, further comprising:

connecting a plurality of third leads of the leadframe to contact pads of the first semiconductor chip, wherein one of the plurality of third leads is connected to an emitter contact pad of the first semiconductor chip, and wherein another of the plurality of third leads is connected to an emitter-sense contact pad of the first semiconductor chip.

* * * * *